US006774742B1

(12) United States Patent
Fleury et al.

(10) Patent No.: US 6,774,742 B1
(45) Date of Patent: Aug. 10, 2004

(54) SYSTEM AND METHOD FOR INTERFACING A COAXIAL CONNECTOR TO A COPLANAR WAVEGUIDE SUBSTRATE

(75) Inventors: Michel Fleury, San Diego, CA (US); Steven Jeffrey Martin, San Diego, CA (US); Jean-Marc Papillon, San Diego, CA (US); Francois Guindon, San Diego, CA (US)

(73) Assignee: Applied MicroCircuits Corporation, San Diego, CA (US)

( * ) Notice: Subject to any disclaimer, the term of this patent is extended or adjusted under 35 U.S.C. 154(b) by 54 days.

(21) Appl. No.: 10/154,053

(22) Filed: May 23, 2002

(51) Int. Cl.$^{7}$ .................................................. H03H 7/38

(52) U.S. Cl. .......................................... 333/33; 333/260

(58) Field of Search ..................... 333/33, 260; 439/63, 439/581, 578, 579, 580

(56) References Cited

U.S. PATENT DOCUMENTS 4,995,815 A * 2/1991 Buchanan et al. ............ 439/63
5,532,659 A * 7/1996 Dodart ........................ 333/260
5,570,068 A * 10/1996 Quan .......................... 333/33
5,832,598 A * 11/1998 Greenman et al. ............ 29/840

OTHER PUBLICATIONS

Precision RF & Microwave Components—Anritsu, Dec. 1999, publication #11410–00235, Rev. A.

* cited by examiner

*Primary Examiner*—Michael Tokar
*Assistant Examiner*—Linh V Nguyen
(74) *Attorney, Agent, or Firm*—Law Office of Gerald Maliszewski

(57) ABSTRACT

A substrate interface system and method are provided for connecting a coplanar waveguide transmission line to a coaxial connector. The system comprises a substrate having a top surface with a coplanar waveguide having a transmission line interposed between coplanar groundplanes. A housing wall assembly has an aperture and an interior surface adjacent the substrate coplanar waveguide. A coaxial connector, mounted in the housing wall assembly through the aperture, has a center conductor connected to the coplanar waveguide transmission line and a ground connected to the housing wall assembly. Extensions are mounted on the wall assembly interior surface, connected to the coplanar waveguide groundplanes. The substrate need not be grounded to the coaxial connector through a substrate bottom surface groundplane/chassis interface. The substrate can include signal trace layers underlying the top surface, and vias proximate to the wall assembly extensions are formed between the coplanar waveguide groundplane and underlying ground layers.

27 Claims, 7 Drawing Sheets

*Transition from Microcircuit to Outside Transmission Line*

SYSTEM AND METHOD FOR INTERFACING A COAXIAL CONNECTOR TO A COPLANAR WAVEGUIDE SUBSTRATE

BACKGROUND OF THE INVENTION

1. Field of the Invention

This invention generally relates to high frequency circuit interfaces and, more particularly, to a system and method for interfacing a coaxial connector to a substrate with a coplanar waveguide structure.

2. Description of the Related Art

High frequency integrated circuits, such as the circuits needed to support OC-768 data rates in communication systems, must be interfaced with test fixtures during design and/or production test procedures. In order to characterize these integrated circuits (ICs) at very high frequencies, it is important to design test fixtures that minimize the level of signal reflections (mismatch) at all discontinuities. Such discontinuities include the cable-to-test fixture transition and the test fixture-to-IC transition. Good electrical performance is obtained if the transition shows a low level of reflection (return loss), resulting in a minimum insertion loss due to mismatch.

FIG. 1 is a partial cross-sectional view depicting a conventional coaxial-to-outside transmission line transition (prior art). Conventionally, high frequency transitions are achieved by fixing a 1.85 mm or 2.4 mm connector assembly (which consist of a glass bead and a connector) in a metal fixture made of a single piece of metal.

For such an interface it is typical that at least some of the signal energy is reflected where it encounters a conductor medium change. In fact, when a high frequency signal travels through a cable and hits a connector, there will be a small amount of the incoming wave that will be reflected towards the source of the wave. Then, after traveling through the connector, the wave encounters a 50 ohm glass bead, which consists of a metal pin inserted in a glass shell, surrounded by a metal shroud. The wave travels in a coaxial transmission mode into a section of a metal wall that holds the glass bead. On the other side of the wall, an electrical connection is made to a coplanar waveguide (CPW) transmission line. The ground reference of the signal must also be transferred with a minimum discontinuity to ensure a good electrical performance. In the above described configuration, the ground is transferred from the single metal piece to the bottom of the substrate.

The above-described interface works well, but can only be used with a limited class of substrates and fixtures. The substrate must be a single layer dielectric with a groundplane immediately under the dielectric. The fixture is a chassis with a single piece that forms the chassis bottom and the chassis walls. The ground connection between the substrate and the coaxial line is made through the chassis. Thus, the substrate is grounded to the chassis through the bottom layer groundplane. Conventionally, only a single layer board can be interfaced using the conventional chassis/coax interface. As is well known in the art, such thin substrates are typically too thin to polish without breakage. Thus, thin substrates often have burrs along the edges that make the substrate difficult to mount flush against the chassis wall and which promote interface mismatches. Also, an unintentional radius formed between the chassis bottom and chassis wall, caused by imperfect machine milling, also prevents the substrate from flush mounting against the chassis wall, and also promotes interface mismatches.

It would be advantageous if a multi-layered substrate with a top surface coplanar waveguide transmission line could be efficiently interfaced with a coaxial connector.

SUMMARY OF THE INVENTION

The present inventions permits a good high frequency electrical connection to be made between a coaxial cable, coming from test equipment for example, and a coplanar waveguide (CPW) transmission line on a substrate top surface, regardless of the thickness of the substrate. This invention is a very high frequency connector launch configuration that receives a signal on one side from a coaxial connector, a 1.85 mm connector for example, and transfers it onto a CPW transmission line. One of the innovations in this transition is in how the ground reference is transferred from the metal wall holding the glass bead, to the CPW transmission line.

The present invention launch design has an assembly feature which permits the enhancement of the electrical performance at the solder connection between the center pin and the attach pad on the CPW transmission line. The metal wall height can be adjusted so that the height of the center pin of the glass bead matches the CPW transmission line despite the substrate thickness.

Accordingly, a substrate interface system is provided for connecting a coplanar waveguide transmission line to a coaxial connector. The system comprises a substrate having a top surface with a coplanar waveguide. The CPW has a transmission line interposed between coplanar groundplanes. A housing wall assembly has an aperture and an interior surface adjacent the substrate coplanar waveguide. A coaxial connector, mounted in the housing wall assembly through the aperture, has a center conductor connected to the coplanar waveguide transmission line, and a ground connected to the housing wall assembly. Extensions are mounted on the wall assembly interior surface, connected to the coplanar waveguide groundplanes.

The substrate need not be grounded to the coaxial connector through a substrate bottom surface groundplane/chassis interface. The substrate may include a plurality of signal trace layers and/or groundplane layers underlying the top surface, and vias proximate to the wall assembly extensions are formed between the coplanar waveguide groundplanes on the top surface and the groundplanes in the layers underlying the surface.

In some aspects of the system, the housing wall assembly is moveable in a vertical plane so that the position of the coaxial connector can be adjusted to connect to the coplanar waveguide transmission line, in response to the substrate thickness. Since the bottom surface of the substrate need not be a groundplane, in some aspects of the system the substrate includes a bottom surface with a plurality of ball grid array (BGA) interfaces.

Additional details of the above-described system and a method for interfacing a coaxial connector to a coplanar waveguide are described below.

DETAILED DESCRIPTION OF THE PREFERRED EMBODIMENTS

Figure 1:
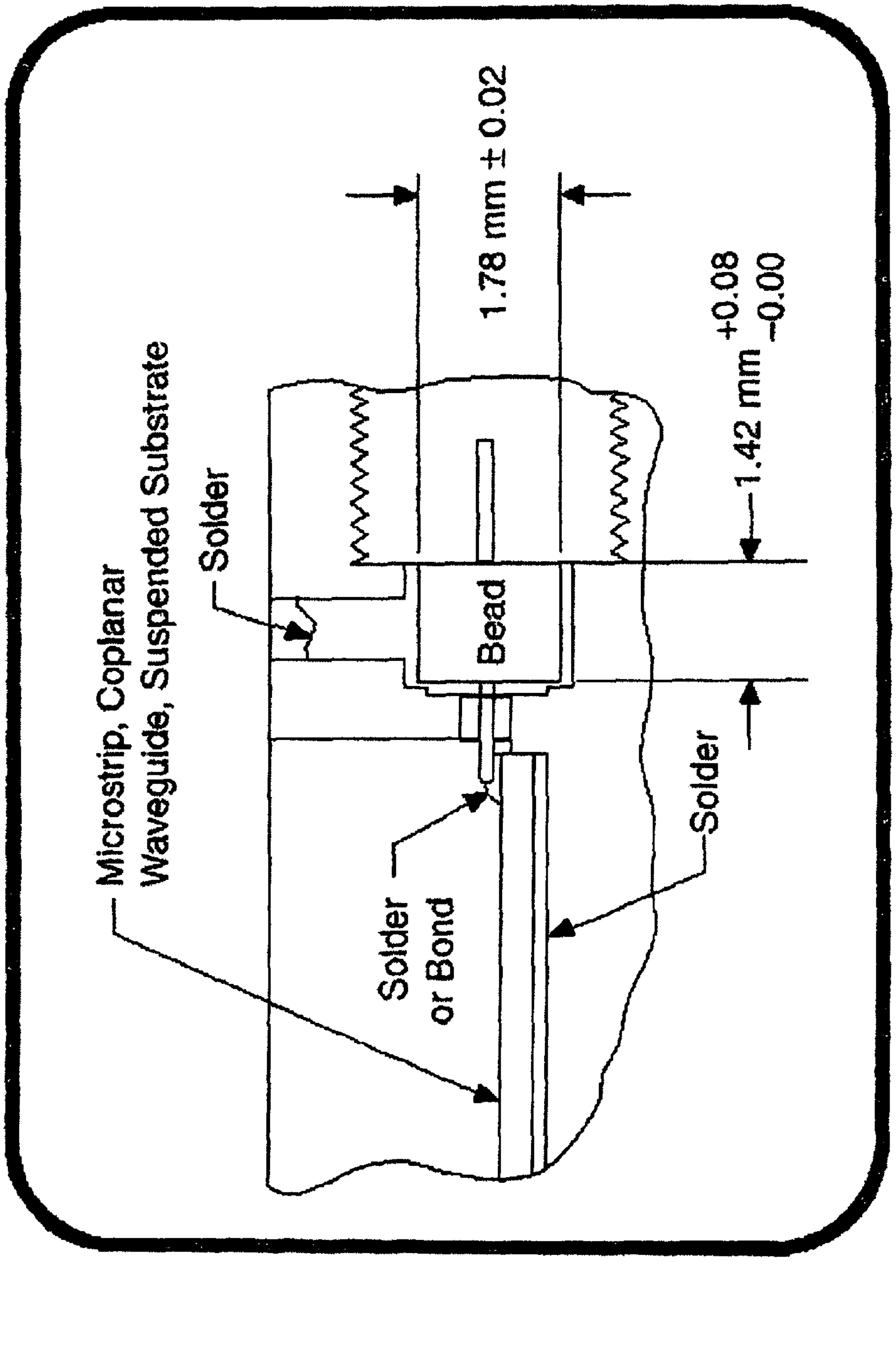
Fig. 1 (prior art)
FIG. 1 is a partial cross-sectional view depicting a conventional coaxial-to-outside transmission line transition (prior art).
Figure 2:
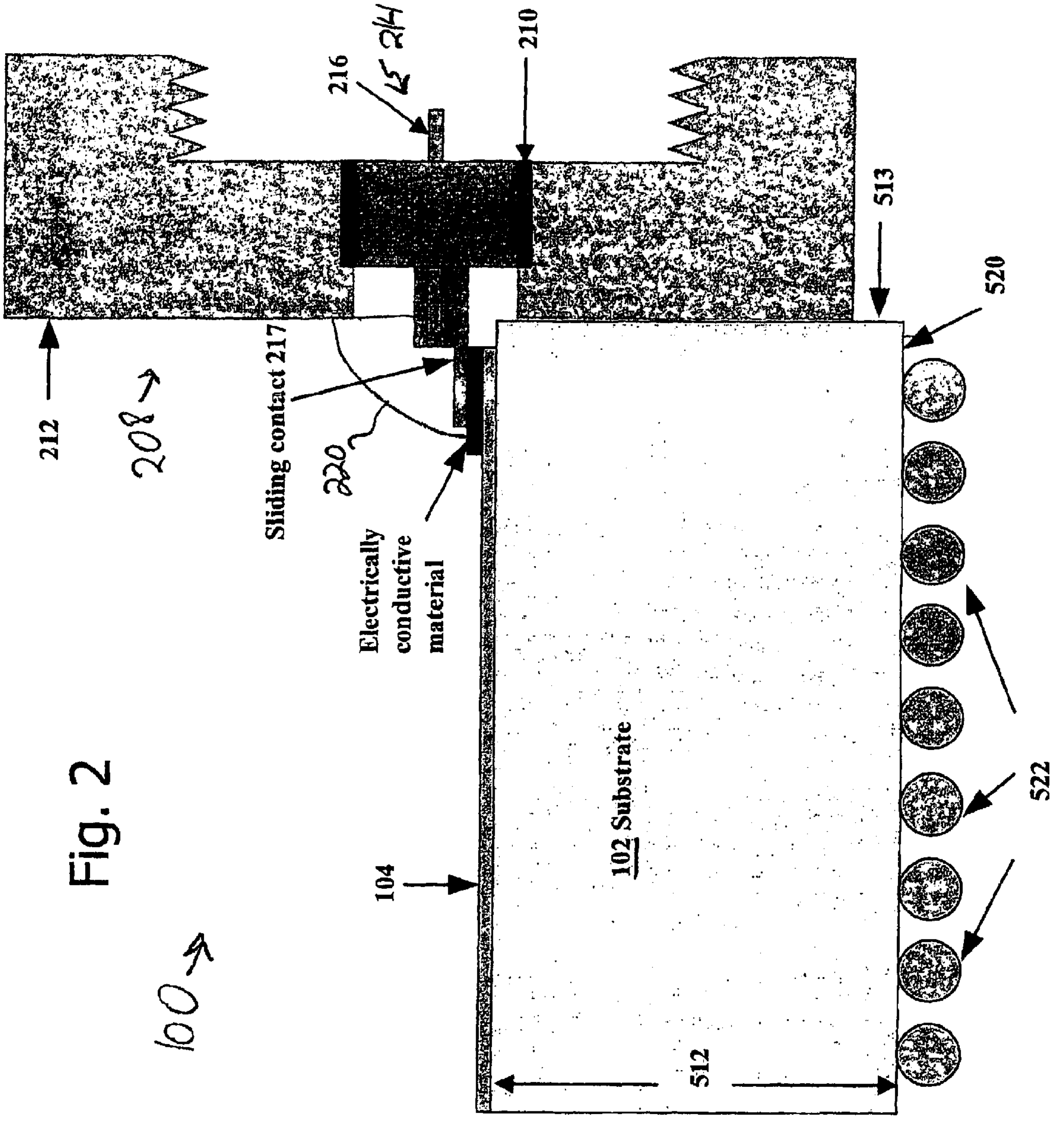
FIG. 2 is a partial cross-sectional view of the present invention substrate interface system for connecting a coplanar waveguide transmission line to a coaxial connector.

FIG. 2 is a partial cross-sectional view of the present invention substrate interface system for connecting a coplanar waveguide transmission line to a coaxial connector. The system 100 comprises a substrate 102 having a top surface 104 in a horizontal plane.

Figure 3:
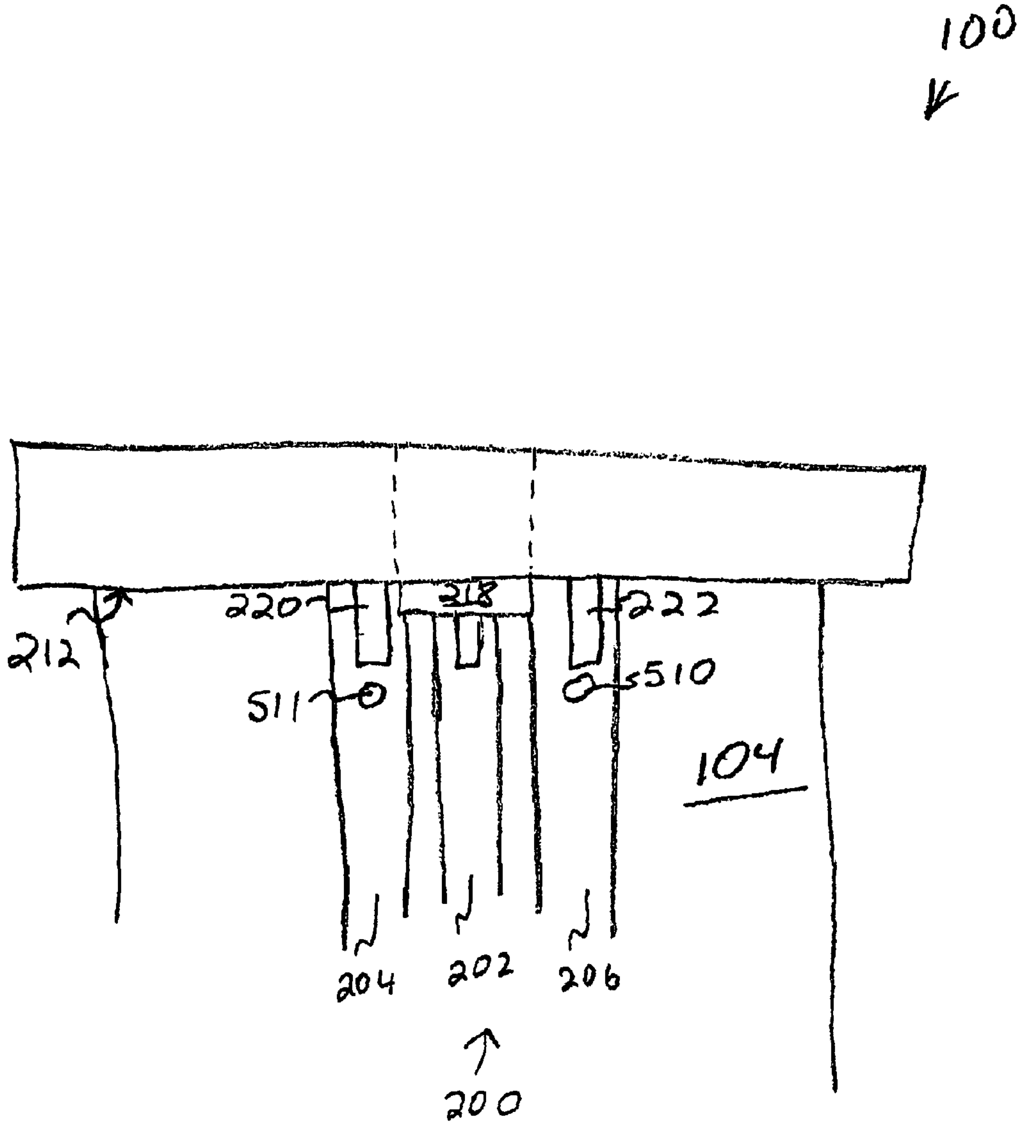
FIG. 3 is a plan view of the substrate top surface of FIG. 2.

FIG. 3 is a plan view of the substrate top surface 104 of FIG. 2. Shown is a coplanar waveguide 200 having a transmission line 202 interposed between coplanar groundplanes 204 and 206.

As seen in FIGS. 2 and 3, a housing wall assembly 208 has an aperture 210 and an interior surface 212 adjacent the substrate coplanar waveguide 200. A coaxial connector 214 is mounted in the housing wall assembly 208 through the aperture 210. The coaxial connector 214 has a center conductor 216 connected to the coplanar waveguide transmission line 202 and a ground connected to the housing wall assembly. The connection from center conductor 216 to the CPW transmission line 202 can be made using an electrically conductive material. Additionally, a sliding contact 217 may be connected to the center conductor 216, in which case a connection is made between the sliding contact 217 and the CPW transmission line 202 using an electrically conductive material. The sliding contact 217 can be said to selectively interface with CPW transmission line 202, as the position of the sliding contact can be adjusted for different line shapes and positions. Further, the sliding contact provides stress relief between the substrate 102 and housing wall assembly 208 in the event of thermal expansion, for example. The connection between the coaxial connector ground and the housing wall assembly is not shown, but could be any conventional connection means. Typically, the coaxial connector ground is connected to the housing wall assembly exterior surface (not shown) via screws. The coaxial connector is can be a 1.85 millimeter (mm) or 2.4 mm connector assembly (with glass bead), GPPO, or other high-frequency push-on connector, to name a few examples. The present invention is not limited to any particular type of coaxial connector.

A dielectric 218 surrounds the center conductor. Extensions 220 and 222 are mounted on the wall assembly interior surface 212 and connected to the coplanar waveguide groundplanes 204 and 206, respectively. Although two extensions are shown, the present invention is not limited to any particular number of extensions. The extensions 220/222 are connected to the coplanar waveguide groundplanes using a electrically conductive material such as copper-silver brazing material, gold-germanium, gold-tin, lead-tin, and silver epoxy, to name a few examples of materials that could be used.

Figure 4:
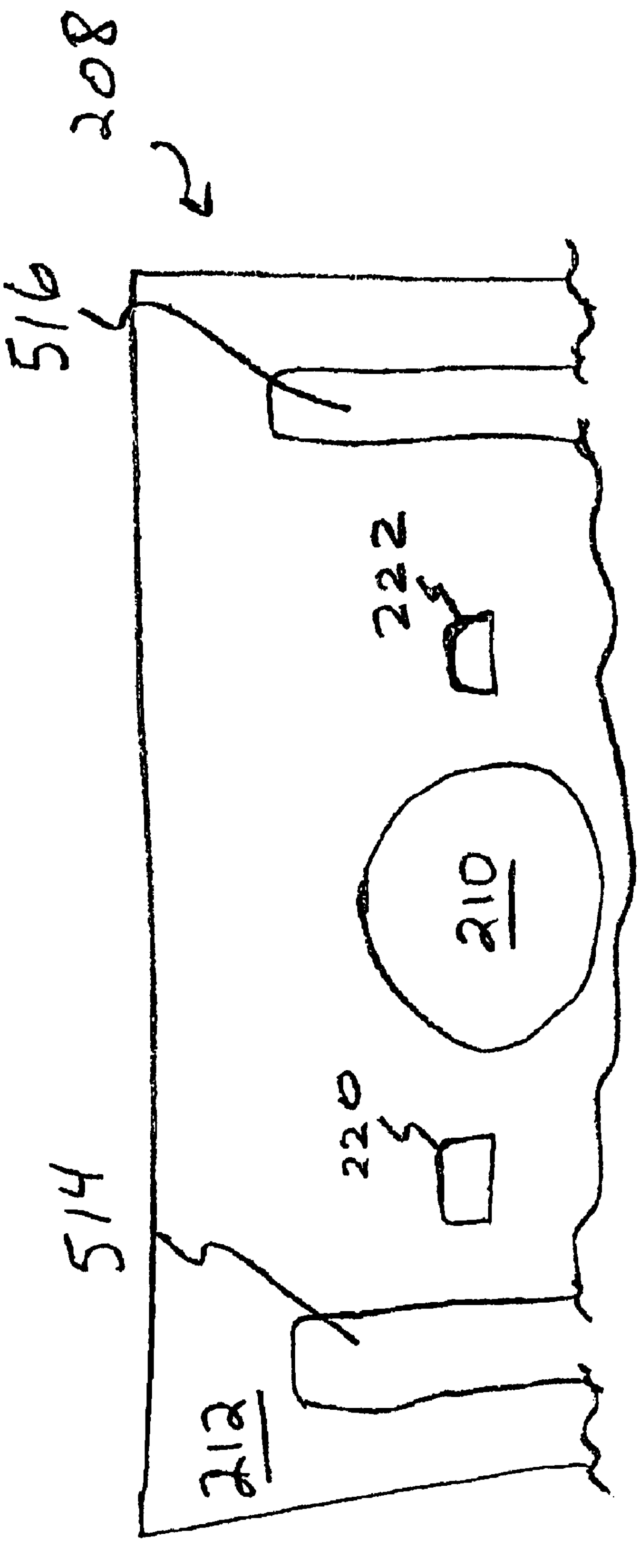
FIG. 4 is a drawing depicting a partial view of the face of the wall assembly, detailing the aperture and the extensions.

FIG. 4 is a drawing depicting a partial view of the face of the wall assembly 208, detailing the aperture 210 and the extensions 220 and 222.

Figure 5:
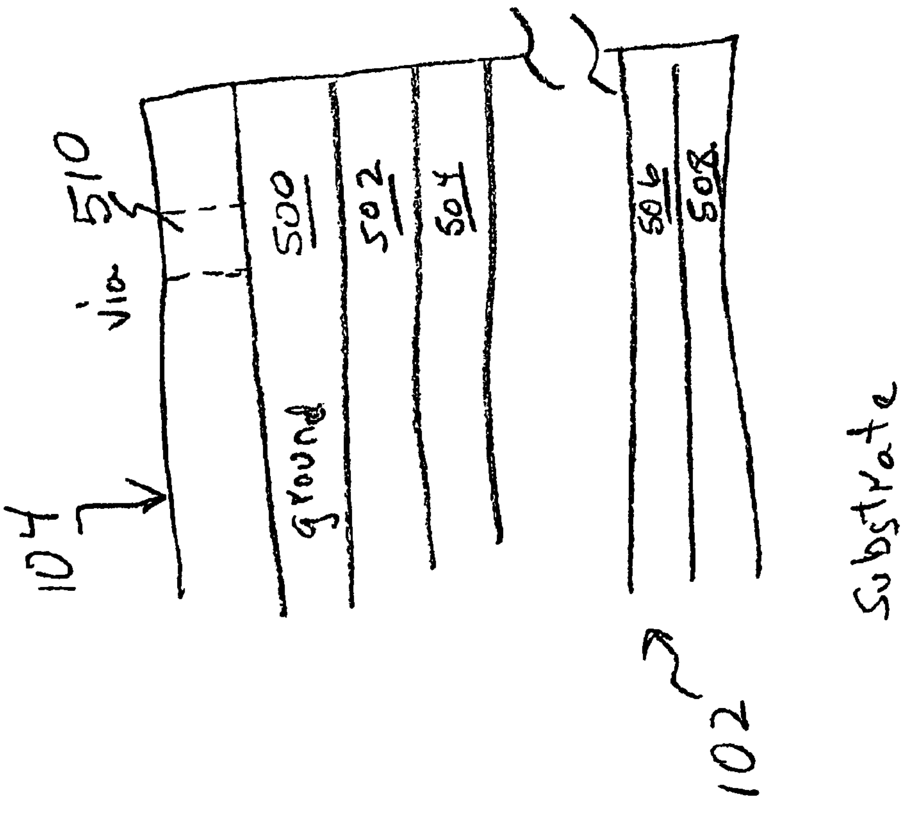
FIG. 5 is a partial cross-sectional view of the substrate of FIG. 2.

FIG. 5 is a partial cross-sectional view of the substrate 102 of FIG. 2. In some aspects of the system 100, the substrate 102 includes signal trace and groundplane layers underlying the top surface 104. Shown are layers 500, 502, 504, 506, and 508, but the present invention substrate is not limited to any particular number of layers. In some aspects of the system, the substrate 102 includes at least 16 layers underlying the top surface 104. Vias are formed between the coplanar waveguide groundplanes 204/206 on the top surface 104 and the groundplanes in the layers underlying the surface. Shown is a via 510 connecting coplanar waveguide groundplane 206 and groundplane layer 500. As shown in FIG. 3, substrate vias 510 and 511 are formed proximate to the wall assembly extension connections 222 and 220, respectively. Note that the present invention is not limited to the use of just two vias. Typically, the vias are filled with an electrically conductive material, such as molybdenum, tungsten, or gold.

Returning to FIG. 2, the substrate 102 has a thickness 512. In some aspects of the system 100, the housing wall assembly 208 is moveable in a vertical plane, which is defined to be perpendicular to the substrate top surface 104 (in the horizontal plane). In this manner, the position of the coaxial connector 214 can be adjusted to connect to the coplanar waveguide transmission line, in response to the substrate thickness 512. Alternately stated, the connector height can be adjusted to mate with the coplanar transmission line on the substrate top surface, regardless of the substrate thickness. In some aspects, the substrate 102 has a thickness 512 greater than 10 mils. In other aspects, the thickness can be greater than 160 mils. With thicknesses of greater than 10 mils, the substrate can have a polished edge 513 adjacent to the wall assembly with a edge tolerance of less than 0.5 mils.

As seen in FIG. 4, in one aspect of the system the housing wall assembly 208 includes two countersink bore slots 514 and 516. Small screws can be inserted (such as #1–72 screws) in the slots to permit the wall assembly to float with respect to a frame (not shown). The slots permit height adjustment in the wall assembly 208 so that the center conductor 216 of the glass bead can be adjusted to mate with the coplanar transmission line. Once the proper height is found, the wall assembly is screwed onto the frame.

Returning again to FIG. 2, some aspects of the system 100 include a substrate bottom surface 520 with a plurality of ball grid array (BGA) interfaces 522. In some aspects, the substrate bottom surface 520 includes more than 255 BGA interfaces 522. Substrates with BGA interfaces can be tested in the present invention system because there is no limitation that the substrate must be grounded through the bottom surface 520. Likewise, a substrate with BGA interfaces can be tested because there is no limitation that the fixture walls and bottom surfaces be formed from a single piece of metal.

Figure 6:
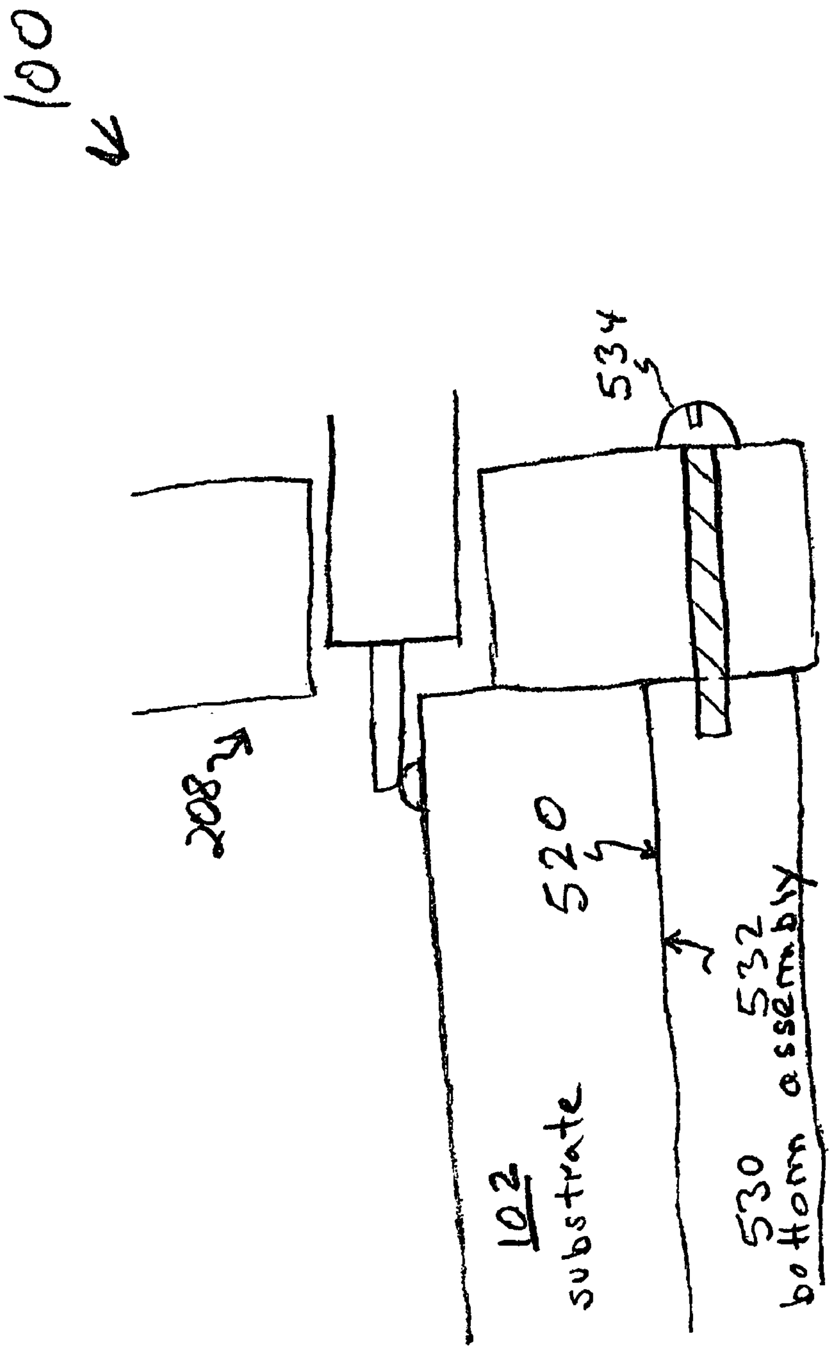
FIG. 6 is a partial cross-sectional view of a present invention system variation including a housing bottom assembly.

FIG. 6 is a partial cross-sectional view of a present invention system variation including a housing bottom assembly. As an alternate the BGA interfaces, in some aspects of the system 100 the substrate 102 includes a bottom surface with ground interfaces, not explicitly shown. The ground interfaces can include via connections to substrate internal layers. In some aspects, the ground interface can cover the entire substrate bottom surface 520. A housing bottom assembly 530 is shown having a top surface 532 in the horizontal plane, independent from the housing wall assembly, underlying the substrate bottom surface 520. The housing bottom assembly is electrically connected to the substrate bottom surface ground interfaces, since the ground interfaces and the bottom assembly 530 are conductive materials, in contact. The bottom assembly 530 is mechanically connected to the housing wall assembly 208. The mechanical connection is shown being made with a screw 534 through slot 516 (see FIG. 4), however, other conventional means of mechanical assembly are also practical.

Figure 7:
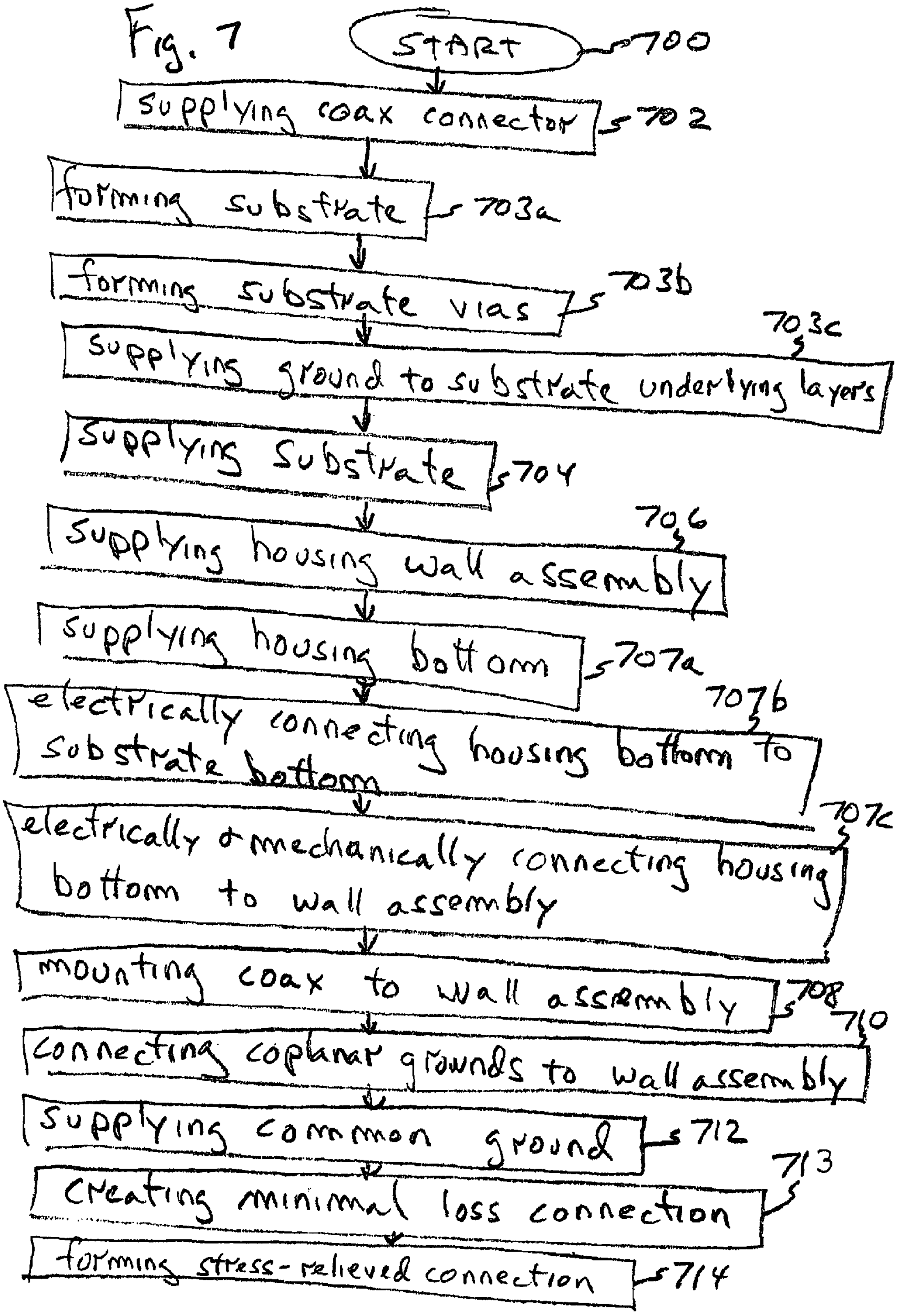
FIG. 7 is a flowchart illustrating the present invention method for interfacing a coaxial connector to a coplanar waveguide.

FIG. 7 is a flowchart illustrating the present invention method for interfacing a coaxial connector to a coplanar waveguide. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 700. Step 702 supplies a coaxial connector having a center conductor, a ground, and a dielectric interposed between the center conductor and the ground. Step 704 supplies a substrate surface with a coplanar waveguide having a transmission line interposed between groundplanes. Step 706 supplies a housing wall assembly with a coaxial connector aperture. Step 708 mounts the coaxial connector to the wall assembly, through the aperture. Step 710 connects the coplanar waveguide groundplanes to the wall assembly. In some aspects of the method, connecting the coplanar waveguide groundplanes to the wall assembly includes connecting the extensions to the coplanar waveguide groundplanes using a material such as copper-silver brazing material, gold-germanium, gold-tin, lead-tin, or silver epoxy. Step 712, in response to the groundplane/wall assembly connections, supplies a ground common the both the substrate and the coaxial connector. In some aspects a further step, Step 714, using a sliding contact attached to the coaxial center conductor, forms a stress-relieved connection to the coplanar waveguide transmission line.

Some aspects of the method include additional steps. Step 703*a* forms a substrate with a plurality of layers underlying the substrate surface. Step 703*b* forms vias in the coplanar waveguide groundplane proximate to the wall assembly connection. Step 703*c* supplies ground to the substrate layers underlying the surface through the vias.

In some aspects, forming the substrate with a plurality of layers underlying the surface in Step 703*a* includes forming a substrate having a thickness of greater than 10 mils.

In other aspects, supplying a housing wall assembly with a coaxial connector aperture in Step 706 includes supplying a housing wall assembly moveable in a vertical plane. Then, mounting the coaxial connector to the wall assembly in Step 708 includes moving the housing wall assembly in response to the substrate thickness.

In some aspects, forming a substrate in Step 703*a* includes forming a substrate bottom surface with ground interfaces. Then, the method includes additional steps. Step 707*a* supplies a housing bottom, independent of the wall assembly. Step 707*b* electrically connects the housing bottom to the substrate bottom surface ground interfaces. Step 707*c* electrically and mechanically connects the housing bottom to the wall assembly.

In other aspects of the method, forming the substrate in Step 703*a* includes forming a plurality of substrate bottom surface ball grid array (BGA) input/output connections.

In some aspects, supplying a coaxial connector in Step 702 includes supplying a 50 ohm coaxial connector and supplying a substrate with a coplanar waveguide in Step 704 includes supplying a 50 ohm coplanar waveguide. Then, a further step, Step 713, in response to the groundplane/wall assembly connections, creates a minimal loss connection between the coplanar waveguide and the coaxial connector. In one aspect, creating a minimal loss connection between the coplanar waveguide and the coaxial connector includes creating a return loss of less than −15 dB at 65 gigahertz (GHz).

A substrate interface system for connecting a coplanar waveguide transmission line to a coaxial connector, and method for same, have been provided. A few examples have been given as to the type of substrates that can now be tested using the present invention concept. However, the present invention is not limited to merely these examples. Examples have also been given of wall and bottom assemblies, but these are just exemplary. Other variations and embodiments of the invention will occur to those skilled in the art.

We claim:

1. A method for interfacing a coaxial connector to a coplanar waveguide, the method comprising:

supplying a coaxial connector having a center conductor, a ground, and a dielectric interposed between the center conductor and the ground;

supplying a substrate surface with a coplanar waveguide having a transmission line interposed between groundplanes;

supplying a housing wall assembly with a coaxial connector aperture;

mounting the coaxial connector ground to the wall assembly;

connecting the coaxial connector center conductor to the coplanar waveguide transmission line, through the aperture;

connecting the coplanar waveguide groundplanes to the wall assembly; and, in response to the groundplane/wall assembly connections, supplying a ground common the both the substrate and the coaxial connector.

2. The method of claim 1 further comprising:

forming a substrate with a plurality of layers underlying the substrate surface;

forming vias in the coplanar waveguide groundplanes proximate to the wall assembly connection; and, supplying ground to the substrate layers underlying the surface through the vias.

3. The method of claim 2 wherein forming the substrate with a plurality of layers underlying the surface includes forming a substrate having a thickness of greater than 10 mils.

4. The method of claim 3 wherein supplying a housing wall assembly with a coaxial connector aperture includes supplying a housing wall assembly moveable in a vertical plane; and, wherein mounting the coaxial connector ground to the wall assembly includes moving the housing wall assembly in response to the substrate thickness.

5. The method of claim 4 wherein forming a substrate includes forming a substrate bottom surface with ground interfaces;

the method further comprising:

supplying a housing bottom, independent of the wall assembly;

electrically connecting the housing bottom to the substrate bottom surface ground interfaces; and, electrically and mechanically connecting the housing bottom to the wall assembly.

6. The method of claim 5 wherein forming the substrate includes forming a plurality of substrate bottom surface ball grid array (BGA) input/output connections.

7. The method of claim 1 wherein supplying a coaxial connector includes supplying a 50 ohm coaxial connector;

wherein supplying a substrate with a coplanar waveguide includes supplying a 50 ohm coplanar waveguide; and, the method further comprising:

in response to the groundplane/wall assembly connections, creating a minimal loss connection between the coplanar waveguide and the coaxial connector.

8. The method of claim 7 wherein creating a minimal loss connection between the coplanar waveguide and the coaxial connector includes creating a return loss of less than −15 dB at 65 gigahertz (GHz).

9. The method of claim 1 wherein connecting the coplanar waveguide groundplanes to the wall assembly includes connecting the extensions to the coplanar waveguide groundplanes using a material selected from the group including copper-silver brazing material, gold-germanium, gold-tin, lead-tin, and silver epoxy.

10. The method of claim 1 further comprising:

using a sliding contact attached to the coaxial center conductor, forming a stress-relieved connection to the coplanar waveguide transmission line.

11. A substrate interface system for connecting a coplanar waveguide transmission line to a coaxial connector, the system comprising:

a substrate having a top surface in a horizontal plane with a coplanar waveguide having a transmission line interposed between coplanar groundplanes;

a housing wall assembly having an aperture and an interior surface adjacent the substrate coplanar waveguide;

a coaxial connector mounted in the housing wall assembly through the aperture, having a center conductor connected to the coplanar waveguide transmission line, a ground connected to the housing wall assembly, and a dielectric surrounding the center conductor; and, extensions mounted on the wall assembly interior surface and connected to the coplanar waveguide groundplanes.

12. The system of claim 11 wherein the substrate includes signal trace and groundplane layers underlying the top surface, and vias formed between the coplanar waveguide groundplanes on the top surface and the groundplanes in the layers underlying the surface.

13. The system of claim 12 wherein the substrate vias are formed proximate to the wall assembly extension connections.

14. The system of claim 13 wherein the substrate has a thickness;

wherein the housing wall assembly is moveable in a vertical plane; and, wherein the position of the coaxial connector can be adjusted to connect to the coplanar waveguide transmission line, in response to the substrate thickness.

15. The system of claim 14 wherein the substrate has a thickness greater than 10 mils.

16. The system of claim 15 wherein the substrate has a thickness greater than 160 mils.

17. The system of claim 14 wherein the substrate includes at least 16 layers underlying the top surface.

18. The system of claim 14 wherein the substrate has an edge adjacent to the wall assembly having a edge tolerance of less than 0.5 mils.

19. The system of claim 14 wherein the coaxial connector is selected from the group including 1.85 millimeter (mm), 2.4 mm, GPPO, and other high-frequency push-on connectors.

20. The system of claim 14 wherein the substrate includes a bottom surface with a plurality of ball grid array (BGA) interfaces.

21. The system of claim 20 wherein the substrate bottom surface includes more than 255 BGA interfaces.

22. The system of claim 14 wherein the substrate includes a bottom surface with ground interfaces;

the system further comprising:

a housing bottom assembly with a top surface in the horizontal plane, independent from the housing wall assembly, underlying the substrate bottom surface, electrically connected to the substrate bottom surface ground interfaces and mechanically connected to the housing wall assembly.

23. The system of claim 14 wherein the extensions are connected to the coplanar waveguide groundplanes using a material selected from the group including copper-silver brazing material, gold-germanium, gold-tin, lead-tin, and silver epoxy.

24. The system of claim 14 wherein the substrate vias are filled with an electrically conductive material selected from the group including gold, molybdenum, and tungsten.

25. The system of claim 14 wherein coaxial connector includes a sliding contact, connected to the center conductor, to selectively interface with the substrate coplanar transmission line.

26. A substrate interface system for connecting a coaxial connector to a coplanar waveguide transmission line, the system comprising:

a housing wall assembly, moveable in a vertical plane, having an interior surface with an aperture for mounting a substrate;

a coaxial connector mounted in the housing wall assembly through the aperture, having a center conductor for connection to a substrate coplanar waveguide transmission line, a ground connected to the housing wall assembly, and a dielectric interposed between the center conductor and the ground; and, extensions mounted on the wall assembly interior surface for connection to substrate coplanar waveguide groundplanes.

27. The system of claim 26 further comprising:

a housing bottom assembly in a horizontal plane, mechanically connected to the housing wall assembly, for electrical connection to a substrate bottom surface.

* * * * *